United States Patent
Ando et al.

(10) Patent No.: US 9,620,384 B2
(45) Date of Patent: Apr. 11, 2017

(54) CONTROL OF O-INGRESS INTO GATE STACK DIELECTRIC LAYER USING OXYGEN PERMEABLE LAYER

(71) Applicant: GLOBALFOUNDRIES Inc., Grand Cayman (KY)

(72) Inventors: Takashi Ando, Tuckahoe, NY (US); Claude Ortolland, Peekskill, NY (US); Kai Zhao, Hopewell Junction, NY (US)

(*) Notice: Subject to any disclaimer, the term of this patent is extended or adjusted under 35 U.S.C. 154(b) by 0 days.

(21) Appl. No.: 14/323,036

(22) Filed: Jul. 3, 2014

(65) Prior Publication Data
US 2016/0005620 A1    Jan. 7, 2016

(51) Int. Cl.
| | | |
|---|---|---|
| H01L 21/3115 | (2006.01) |
| H01L 21/02 | (2006.01) |
| H01L 21/28 | (2006.01) |
| H01L 29/51 | (2006.01) |
| H01L 29/66 | (2006.01) |
| H01L 29/49 | (2006.01) |

(52) U.S. Cl.
CPC .... *H01L 21/3115* (2013.01); *H01L 21/02323* (2013.01); *H01L 21/02337* (2013.01); *H01L 21/28176* (2013.01); *H01L 21/28194* (2013.01); *H01L 29/511* (2013.01); *H01L 29/517* (2013.01); *H01L 29/6656* (2013.01); *H01L 29/66545* (2013.01); *H01L 29/4966* (2013.01)

(58) Field of Classification Search
None
See application file for complete search history.

(56) References Cited

U.S. PATENT DOCUMENTS

| | | | |
|---|---|---|---|
| 6,764,966 B1* | 7/2004 | En | H01L 29/6656 257/E21.423 |
| 6,830,998 B1* | 12/2004 | Pan | H01L 21/28088 257/E21.204 |
| 7,217,611 B2 | 5/2007 | Kavalieros et al. | |
| 7,488,656 B2 | 2/2009 | Cartier et al. | |
| 2006/0157750 A1 | 7/2006 | Kim et al. | |
| 2008/0242012 A1* | 10/2008 | Pae | H01L 21/28079 438/197 |
| 2008/0272438 A1* | 11/2008 | Doris | H01L 21/28176 257/369 |
| 2008/0308872 A1* | 12/2008 | Bu | H01L 21/823857 257/369 |
| 2010/0072523 A1* | 3/2010 | Sato | H01L 21/28088 257/289 |
| 2011/0254093 A1* | 10/2011 | Wang | H01L 21/823857 257/368 |

* cited by examiner

*Primary Examiner* — Mary Wilczewski
*Assistant Examiner* — Erik T Peterson
(74) *Attorney, Agent, or Firm* — Heslin, Rothenberg, Farley & Mesiti, PC; George S. Blasiak (57) ABSTRACT

A method of manufacturing a semiconductor structure, by depositing a dielectric layer is a dummy gate, or an existing gate structure, prior to the formation of gate spacers. Following the formation of spacers, and in some embodiments replacing a dummy gate with a final gate structure, oxygen is introduced to a gate dielectric through a diffusion process, using the deposited dielectric layer as a diffusion pathway.

10 Claims, 8 Drawing Sheets

CONTROL OF O-INGRESS INTO GATE STACK DIELECTRIC LAYER USING OXYGEN PERMEABLE LAYER

BACKGROUND

The present invention relates to manufacturing semiconductor devices, particularly to manufacturing high-K gate dielectric layers for Field Effect Transistor (FET) structures.

FETs are commonly employed in electronic circuit applications. FETs may include a source region and a drain region spaced apart by a semiconductor channel region. In planar FETs, the semiconductor channel region may be a semiconductor substrate. In finFETs, the semiconductor channel region may be a semiconductor fin. A gate, potentially including a gate dielectric layer, a work function metal layer, and a metal electrode, may be formed above the channel region. By applying voltage to the gate, the conductivity of the channel region may increase and allow current to flow from the source region to the drain region.

FinFETs are an emerging technology which may provide solutions to field effect transistor (FET) scaling problems at, and below, the 22 nm node. FinFET structures include at least one narrow semiconductor fin as the channel region of the FET and are gated on at least two sides of each of the at least one semiconductor fin. FinFETs including more than one fin may be referred to as multi-fin FinFETs. FinFETs may be formed on bulk substrates to reduce wafer cost and/or enable formation of certain devices in the bulk substrate.

Thus, operational characteristics associated with either planar FETs or finFETs may be varied based on, for example, the device application.

BRIEF SUMMARY

An embodiment of the invention may include a method of forming a semiconductor structure. The method may include depositing a first dielectric layer over a substrate and a gate structure. The gate structure may be a gate dielectric layer located above the substrate and a gate electrode located above the gate dielectric layer. A portion of the first dielectric layer is formed on opposing sidewalls of the gate structure. Subsequently, a second dielectric layer may be deposited over the first dielectric layer. A spacer pair may be formed on the gate structure based on a portion of the second dielectric located on the portion of the first dielectric layer located on the opposing sidewalls. The portion of the first dielectric layer transports oxygen to the gate dielectric layer when the semiconductor structure is exposed to an oxygen environment.

Another embodiment of the invention may include a method of forming a semiconductor structure. The method may include depositing first dielectric layer over a substrate and a dummy gate structure. A second dielectric layer may be deposited over the first dielectric layer. A spacer pair may be formed on the gate structure based on a portion of the second dielectric deposited on the portion of the first dielectric layer located on the opposing sidewalls. Removal of the dummy gate structure may then occur. Depositing a gate structure between the first dielectric layer may occur. The gate structure may include a gate dielectric layer located above the substrate and a gate electrode located above the gate dielectric layer. The portion of the first dielectric layer may transport oxygen to the gate dielectric layer when exposing the semiconductor structure to an oxygen environment.

Another embodiment of invention may include a semiconductor structure containing a substrate, a gate structure located above the substrate, a dielectric layer and a spacer pair. The gate structure comprises a gate dielectric located above the substrate and a gate electrode located above the gate dielectric layer. A portion of the dielectric layer is located on opposing sidewalls of the gate structure. The spacer pair is located on opposing sides of the dielectric layers and located on opposing sidewalls of the gate structure.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Gate dielectric layers in Field Effect Transistors (FET) and FinFET devices may be comprised of dielectric materials, such as high-K dielectric materials. Such structures are used in a gate first or a gate last process, and may contribute to the functional parameters of the semiconductor gate, such as, for example, the threshold voltage. Once a gate stack dielectric layer has been deposited, tuning the threshold voltage of specific gates may achieve the desired gate speed and current leakage across individual gates of a device. Tuning of gate parameters may be accomplished by adding oxygen to the dielectric material. More specifically, the amount of oxygen added to the dielectric material may be adjusted by forming an oxygen transport layer adjacent to the gate dielectric layer and exposing the transport layer to an oxygen environment. In such structures, the oxygen can diffuse through the oxygen transport layer into the dielectric material, thus changing the material properties of the dielectric material and allowing one to further tune the properties of the resultant gate.

Figure 1A:
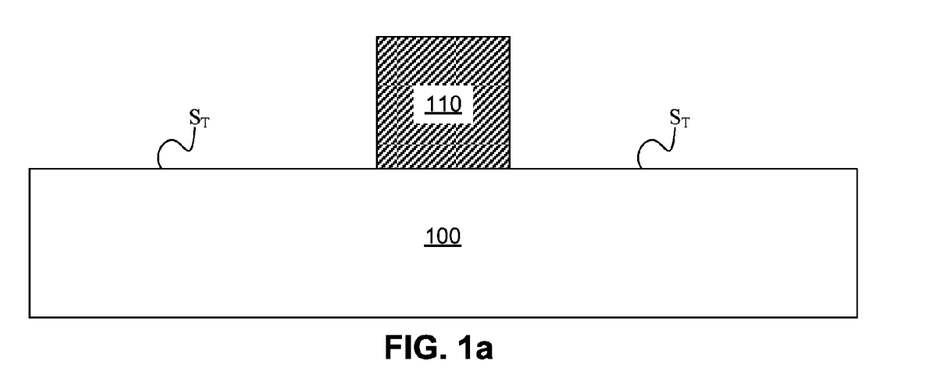
FIG. 1a is a cross-sectional view depicting a dummy gate on a substrate, according to an exemplary embodiment.

Referring to FIG. 1a, in a gate last process, a dummy gate 110 may be provided on a substrate 100. The substrate 100 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In some embodiments, the substrate 100 may be a bulk semiconductor substrate. In such embodiments, the substrate 100 may be approximately, but is not limited to, several hundred microns thick. For example, the substrate 100 may have a thickness ranging from approximately 0.5 mm to approximately 1.5 mm. In other embodiments the substrate 100 may be a semiconductor-on-insulator (SOI) substrate, where a buried insulator layer (not shown) separates a base substrate (not shown) from a top semiconductor layer. In other embodiments where a finFET structure is being fabricated, the substrate 100 may be a semiconductor fin.

As depicted, the dummy gate 110 may be located above the substrate 100. The dummy gate 110 may function as a placeholder for a later-formed replacement metal gate. In such embodiments, the dummy gate 110 may be made of any suitable sacrificial material, for example, amorphous or polycrystalline silicon. The dummy gate 110 may have any thickness ranging from approximately 30 nm to approximately 200 nm.

Figure 1B:
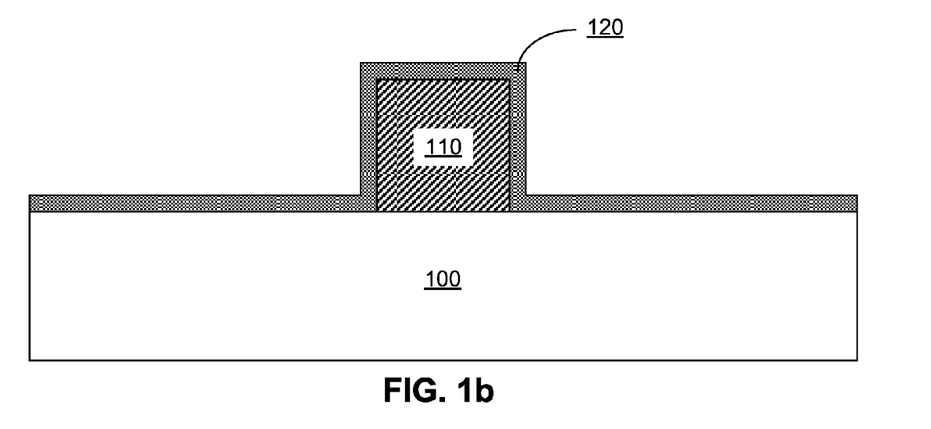
FIG. 1b is a cross-sectional view depicting depositing an oxygen permeable layer on the dummy gate and the substrate, according to an exemplary embodiment.

Referring to FIG. 1b, an oxygen permeable layer 120 may be deposited over the dummy gate 110 and the top surface $S_T$ (FIG. 1a) of the substrate 100. The oxygen permeable layer 120 may be any number of oxygen permeable materials, such as, for example, silicon oxide ($Si_xO_y$) and/or high-K dielectric materials, such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The oxygen permeable layer 120 may be deposited by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

In some embodiments, the oxygen permeable layer 120 may be selectively etched to remove the oxygen permeable layer 120 from regions of a semiconductor, or create multiple heights of the oxygen permeable layer 120. The oxygen permeable layer 120 may be etched using lithographic patterning and etching techniques typically known in the art, such as reactive ion etching (RIE) and plasma etching.

Figure 1C:
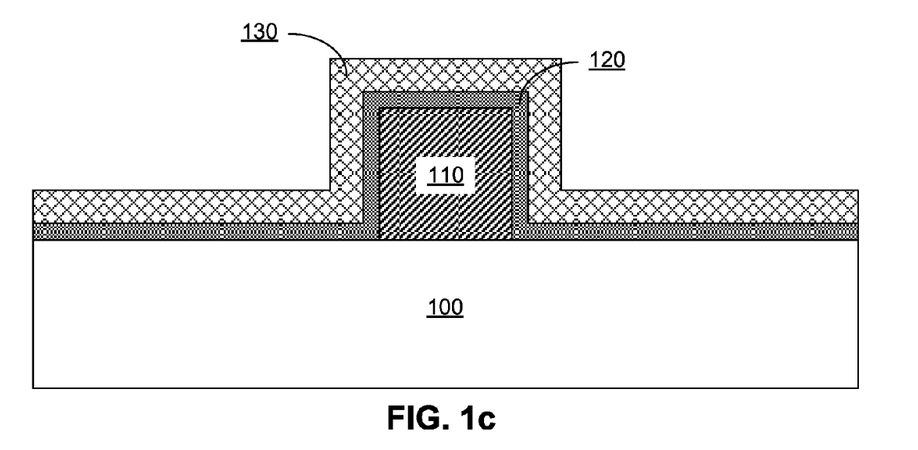
FIG. 1c is a cross-sectional view depicting depositing a spacer layer substrate on the dummy gate and the substrate, according to an exemplary embodiment.

Referring to FIG. 1c, a spacer layer 130 may be formed above the oxygen permeable layer 120. The spacer layer 130 may be made of any insulating material, such as silicon nitride, silicon oxide, silicon oxynitrides, or a combination thereof. The spacer layer 130 may have a thickness ranging from 2 nm to approximately 100 nm, preferably approximately 2 nm to approximately 25 nm. The spacer layer 130 may be formed by any method known in the art, including depositing a conformal silicon nitride layer over the dummy gate 110.

Figure 1D:
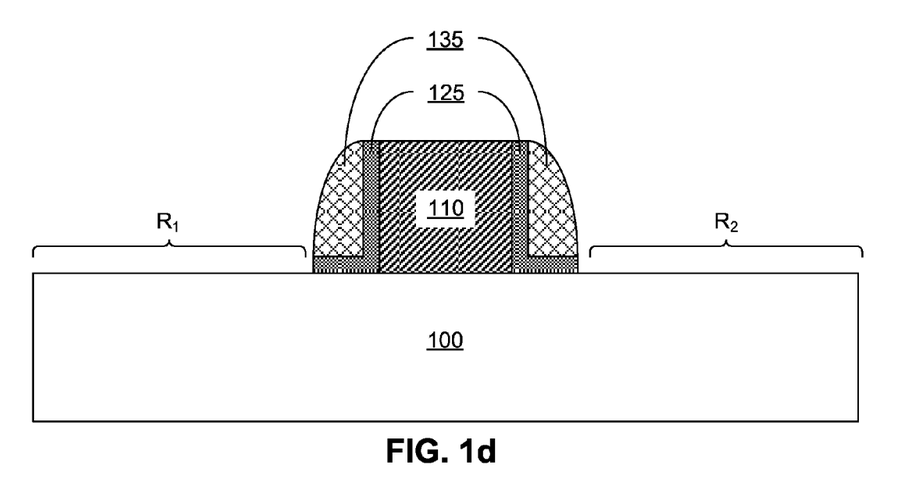
FIG. 1d is a cross-sectional view depicting formation of a spacer and an oxygen transport layer, according to an exemplary embodiment.

Referring to FIG. 1d, a spacer pair 135 and an oxygen transport layer 125 may be formed by removing unwanted material. For example, a RIE etch selective to silicon may be utilized to remove a portion of the oxygen permeable layer 120 and a portion of the spacer layer 130 from regions $R_1$ and $R_2$. Following creation of the spacer pair 135, the oxygen transport layer 125 is maintained as a layer between the spacer pair 135 and the substrate 100. Further, the oxygen transport layer 125 is located between the spacer pair 135 and the dummy gate 110, preferably acting as a sidewall for the dummy gate 110. Removal of unwanted material may occur using an anisotropic etching process such as, for example, reactive ion etching (RIE) or plasma etching.

Figure 1E:
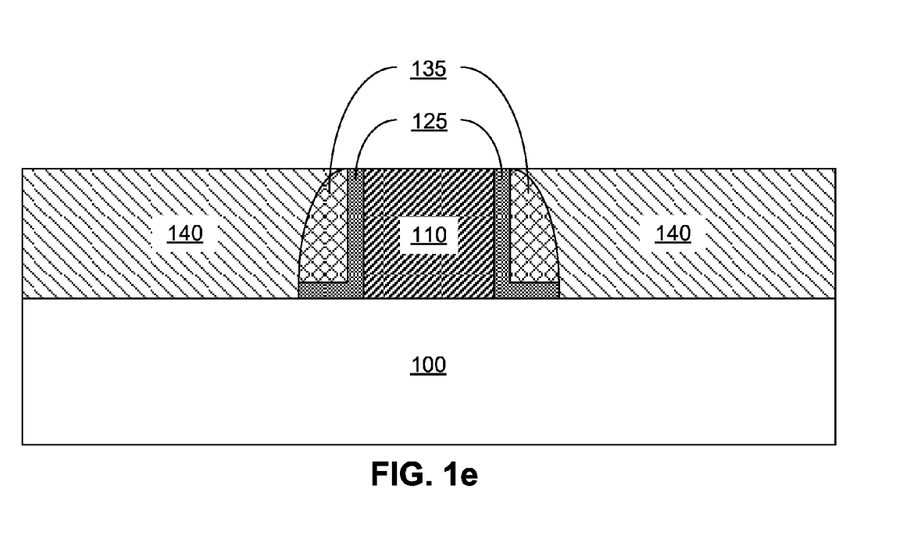
FIG. 1e is a cross-sectional view depicting depositing an inter layer dielectric (ILD), according to an exemplary embodiment.

Referring to FIG. 1e, an ILD layer 140 may be deposited above the FET structure depicted in FIG. 1d. The ILD layer 140 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. In some embodiments, various barriers or liners (not shown) may be formed below the ILD layer 140.

Figure 1F:
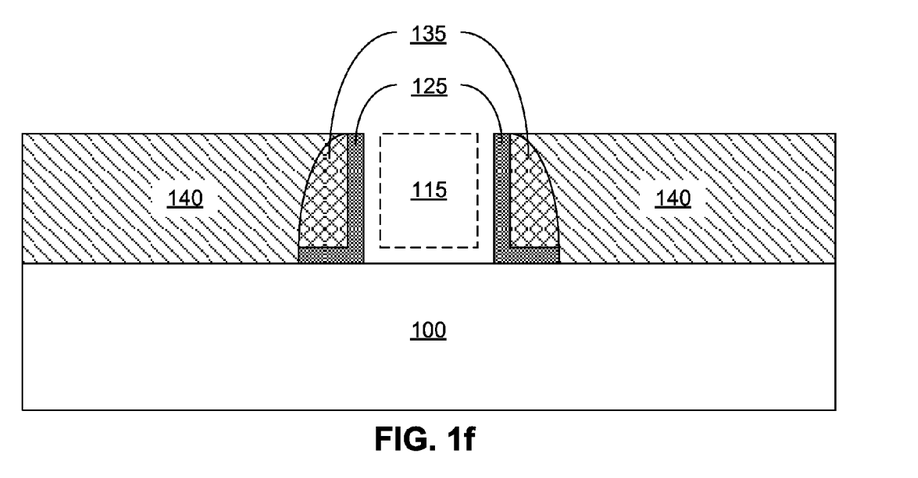
FIG. 1f is a cross-sectional view depicting removing the dummy gate, according to an exemplary embodiment.

Referring to FIG. 1f, the dummy gate 110 (FIG. 1e) may be removed to create a gate recess 115. In an exemplary embodiment, the dummy gate 110 may be removed, for example, by a reactive ion etching (RIE) process capable of selectively removing the amorphous or polycrystalline silicon without removing the ILD layer 140 or the substrate 100.

Figure 1G:
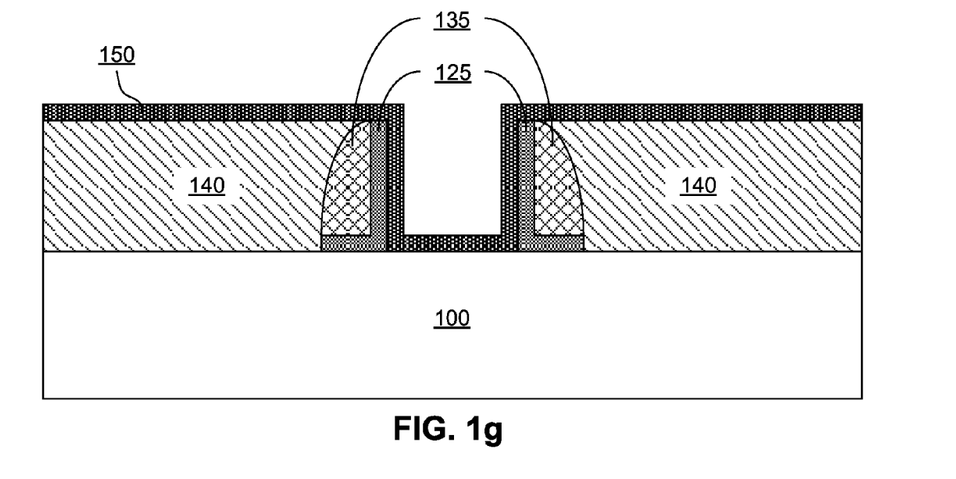
FIG. 1g is a cross-sectional view depicting depositing a gate stack dielectric layer, according to an exemplary embodiment.
Figure 1H:
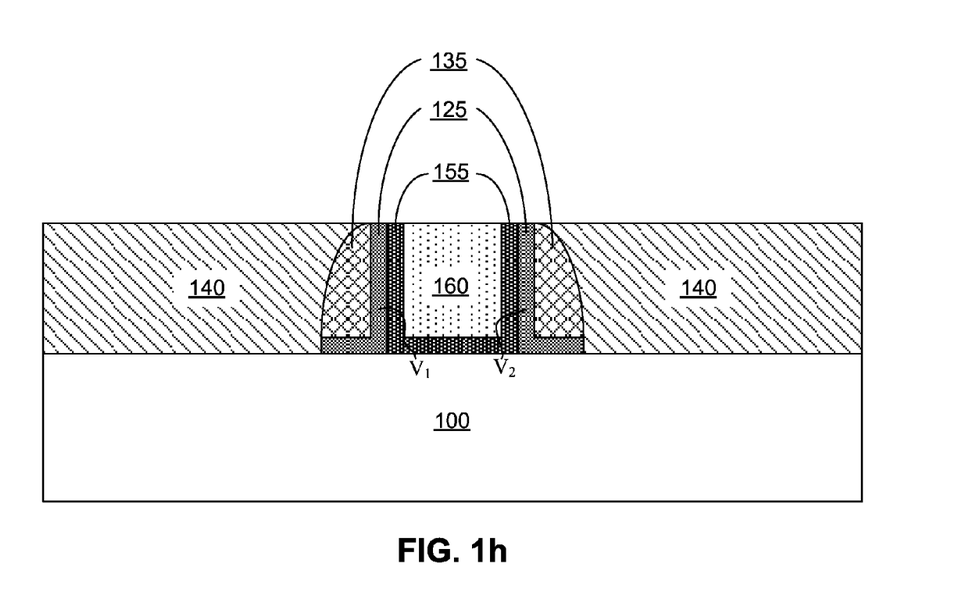
FIG. 1h is a cross-sectional view depicting depositing and planarizing a gate electrode, according to an exemplary embodiment.

Further referring to FIG. 1g, a gate stack dielectric layer 150 may be deposited above the ILD layer 140 and in the gate recess 115 (FIG. 1f). The gate stack dielectric layer 150 may be any number of materials such as, for example, silicon oxide ($Si_xO_y$) and/or high-K dielectric materials, such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The gate stack dielectric layer 150 may be deposited by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD). Following the deposition of the gate stack dielectric layer 150, as illustrated in FIG. 1h, chemical mechanical planarization (CMP) may be performed to remove the high-K material that is not located in the gate recess 115, to create a gate dielectric layer 155 (FIG. 1h). In exemplary embodiments, the gate dielectric layer 155 may be made of the same material as the oxygen transport layer 125. As depicted, the deposited gate dielectric layer 155 is located on the opposing sidewalls of the gate recess 115, which are formed by vertical portions $V_1$ and $V_2$ of the oxygen transport layer 125.

Referring to FIG. 1h, a gate electrode 160 may be deposited using any suitable method known in the art, including for example typical deposition techniques such as CVD, PVD, and ALD, sputtering, and plating. Following deposition, CMP may be performed so that the gate electrode is substantially located inside the gate recess 115 (FIG. 1f). The gate electrode 160 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof.

Figure 1I:
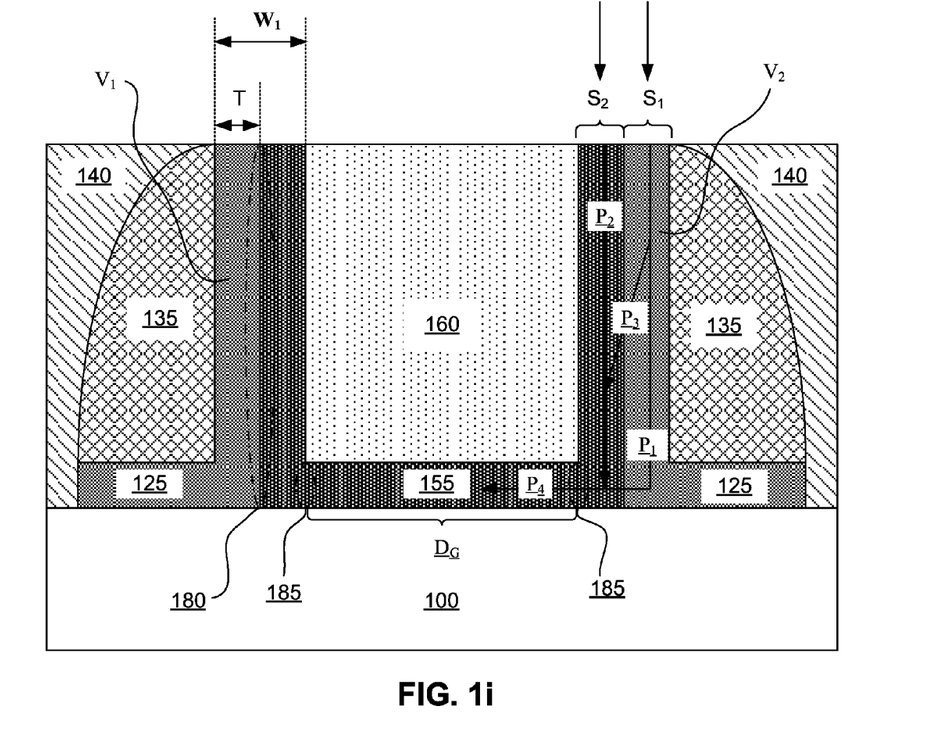
FIG. 1i is a cross-sectional view depicting introducing oxygen into a gate dielectric layer, according to an exemplary embodiment.

Referring to FIG. 1i, introduction of oxygen into the gate dielectric layer 155 may be performed. In exemplary embodiments, oxygen may be introduced into the gate dielectric layer 155 by placing the structure in an oxygen environment and allowing the oxygen to diffuse into the gate dielectric layer 155. Oxygen diffusion from the environment, and into the gate dielectric layer 155 may occur, and be mediated by, oxygen vacancies in the oxygen transport layer 125. As illustrated in FIG. 1i, oxygen in the surrounding environment may be absorbed at the top surface $S_1$ of the oxygen transport layer 125 and follow diffusion pathway, similar to those illustrated by $P_1$ or $P_3$, through a substantially vertical portion of the oxygen transport layer 125, past a substantially vertical contact region 180 and into the gate dielectric layer 155. As illustrated, the vertical contact region 180 may be formed at the interface between the oxygen transport layer 125 and the gate dielectric layer 155. Additionally, oxygen in the surrounding environment may be absorbed at the top surface $S_2$ of the gate dielectric layer 155, and follow diffusion pathway similar to $P_2$, through the vertical portion of the gate dielectric layer 155. Once oxygen is below the gate electrode 160, it may then follow $P_4$ through an ingress region 185, into a portion of the gate dielectric layer $D_G$ located between the substrate 100 and the gate electrode 160. Varying the amount of oxygen contained in the portion of the gate dielectric layer $D_G$ may lead to changes in the threshold voltage of the device. Thus, controlling the amount of oxygen that passes through the ingress region 185 and into the portion of the gate dielectric layer 155 between the substrate 100 and the gate electrode 160 may allow for tuning the threshold voltage based on the diffused oxygen concentration.

The amount of oxygen that passes through the ingress region 185 may be controlled by changing the thickness T of the oxygen transport layer 125. Increasing the thickness T of the oxygen transport layer 125 increases the width of the oxygen diffusion pathway $W_1$. Increasing the width of the oxygen diffusion pathway $W_1$ may increase the amount of oxygen that passes through the ingress regions 185 and into a portion of the gate dielectric layer $D_G$. Conversely, decreasing the thickness of the oxygen transport layer 125, decreases the width of the oxygen diffusion pathway $W_1$, and may decrease the amount of oxygen that passes through the ingress region 185. Thus, changing the thickness T of the oxygen transport layer 125, among other things, controls the amount of oxygen that may diffuse into the gate dielectric layer 155, and ultimately controls the final threshold voltage of the gate. Following oxygen diffusion, the portion of the gate dielectric layer $D_G$ may contain, but is not limited to, an oxygen vacancy concentration ranging from, for example, approximately $1 \times 10^{12}$ to approximately $1 \times 10^{14}/cm^2$.

In some embodiments, introducing oxygen may be performed using a high temperature oxygen anneal. The high temperature anneal may be performed at temperatures ranging from approximately 300° Celsius to approximately 500° Celsius and may be annealed for approximately 30 to approximately 1800 seconds. In some embodiments, the annealing temperature may be substantially uniform throughout the annealing period, however in other embodiments the annealing period may include one or more ramping cycles where the temperature is decreased or increased.

Following the introduction of oxygen a semiconductor structure of FIG. 1i may include a gate dielectric directly contacting a substrate, whereby at least a portion of the gate dielectric layer 155 extends vertically to form at least a portion of the sidewalls of a gate structure. The oxygen transport layer 125 may be present adjacent to the gate dielectric layer 155, where the oxygen transport layer 125 has at least a portion, $V_1$ and $V_2$, extending vertically along the outside of the sidewalls of the gate, to the top surface of the gate structure. The oxygen transport layer 125 has a surface $S_1$ that forms an interface between the structure and the gaseous environment. A spacer pair is located adjacent to the vertical portions $V_1$ and $V_2$ of the oxygen transport layer 125, on the vertical surface furthest from the gate structure. In some embodiments, the portion of the gate dielectric layer $D_G$ may contain a substantially uniform amount of oxygen, or oxygen vacancies, and may be substantially similar to the oxygen concentration, or oxygen vacancy concentration, of the oxygen transport layer 125 near the surfaces $S_1$ and $S_2$. In other embodiments, portion of the gate dielectric layer $D_G$ may contain a range of concentrations, wherein the lowest oxygen concentration (and highest oxygen vacancy concentration) is near the center of the portion of the gate dielectric layer $D_G$, and the highest oxygen concentration (and lowest oxygen vacancy concentration) is near the portion of the gate dielectric layer $D_G$ closest to the ingress region 185. In such embodiments, the portion of the gate dielectric layer $D_G$ may contain a concentration different from the concentration of oxygen located just under the surface $S_1$ and $S_2$.

Figure 2A:
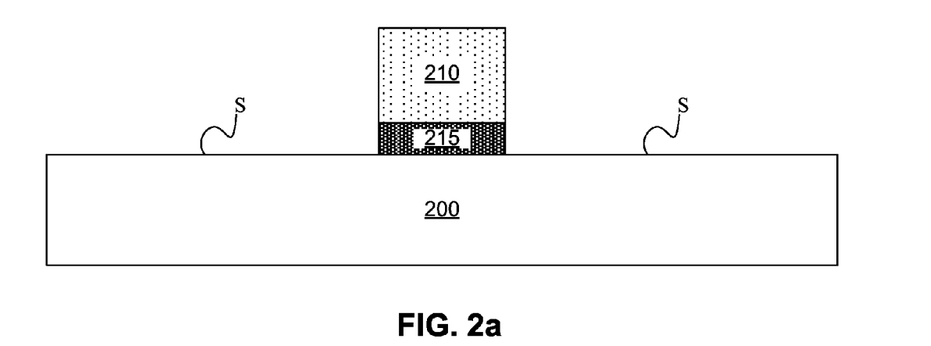
FIG. 2a is a cross-sectional view depicting a gate dielectric layer and a gate electrode on a substrate, according to an exemplary embodiment.

Referring to FIG. 2a, in a gate first process, a substrate 200 and a gate structure, that may include, for example, a gate dielectric layer 215 and a gate electrode 210, may be provided. The substrate 200 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In some embodiments, the substrate 200 may be a bulk semiconductor substrate. In such embodiments, the substrate 200 may be approximately, but is not limited to, several hundred microns thick. For example, the substrate 200 may have a thickness ranging from approximately 0.5 mm to approximately 1.5 mm. In other embodiments the substrate 200 may be a semiconductor-on-insulator (SOI) substrate, where a buried insulator layer (not shown) separates a base substrate (not shown) from a top semiconductor layer. In other embodiments where a finFET structure is being fabricated, the substrate 200 may be a semiconductor fin.

The gate dielectric layer 215 may include any dielectric materials such as, for example, silicon oxide ($Si_xO_y$) and/or high-K dielectric materials such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The gate dielectric layer 215 may be deposited using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). The gate electrode 210 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode 210 may be formed using any suitable metal deposition technique, including, for example, CVD, PVD, and ALD, sputtering, and plating.

Figure 2B:
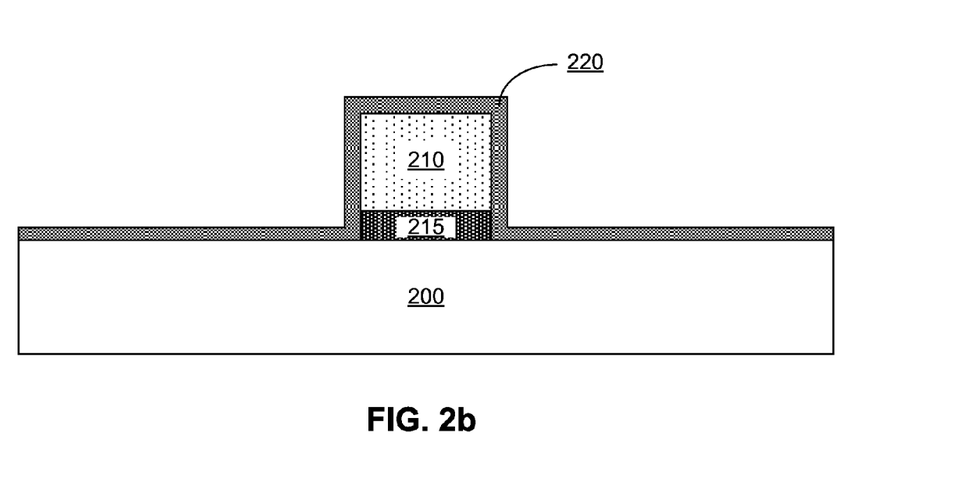
FIG. 2b is a cross-sectional view depicting depositing an oxygen permeable layer on the dummy gate and the substrate, according to an exemplary embodiment.

Referring to FIG. 2b, an oxygen permeable layer 220 may be deposited over the gate structure and the top surface S of the substrate 100. The oxygen permeable layer 220 may be any number of oxygen permeable materials such as, for example silicon oxide ($Si_xO_y$) and/or high-K dielectric materials, such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The oxygen permeable layer 220 may be deposited by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

In some embodiments, the oxygen permeable layer 220 may be selectively etched to remove the oxygen permeable layer 220 from regions of a semiconductor, or create multiple heights of the oxygen permeable layer 220. The oxygen permeable layer 220 may be etched using lithographic patterning and etching techniques typically known in the art, such as reactive ion etching (RIE) and plasma etching.

Figure 2C:
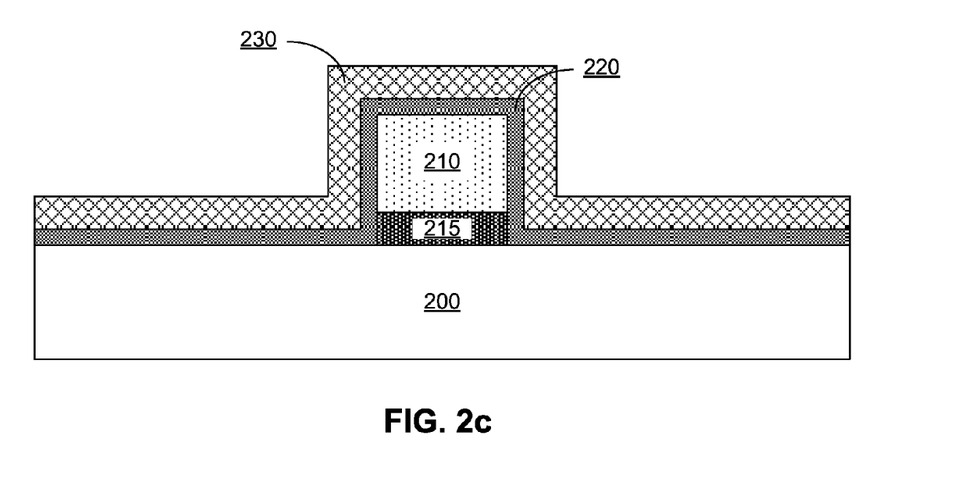
FIG. 2c is a cross-sectional view depicting depositing a spacer layer substrate on the dummy gate and the substrate, according to an exemplary embodiment.

Referring to FIG. 2c, a spacer layer 230 may be formed above the oxygen permeable layer 220. The spacer layer 230 may be made of any insulating material, such as silicon nitride, silicon oxide, silicon oxynitrides, or a combination thereof. The spacer layer 230 may have a thickness ranging from 2 nm to approximately 100 nm, preferably approximately 2 nm to approximately 25 nm. The spacer layer 230 may be formed by any method known in the art, including depositing a conformal silicon nitride layer over the gate electrode 210.

Figure 2D:
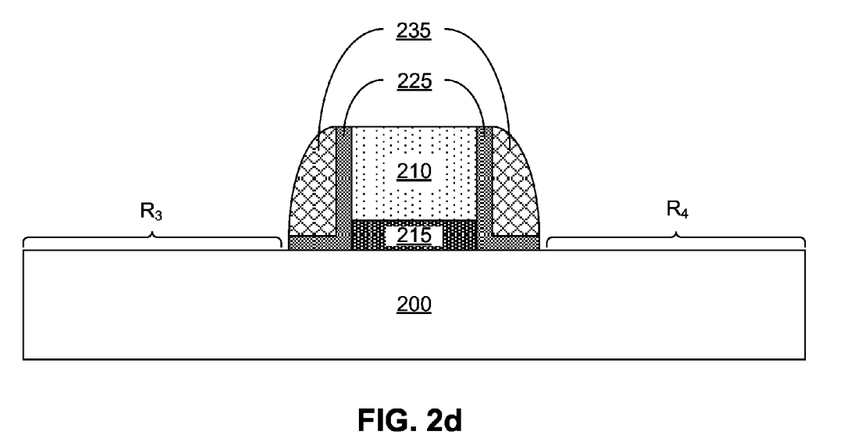
FIG. 2d is a cross-sectional view depicting formation of a spacer and an oxygen transport layer, according to an exemplary embodiment.

Referring to FIG. 2d, a spacer pair 235 and an oxygen transport layer 225 may be formed by removing unwanted material. For example, a RIE etch may be utilized to remove a portion of the oxygen permeable layer 220 and a portion of the spacer layer 230 from regions $R_3$ and $R_4$. Following creation of the spacer pair 235, the oxygen transport layer 225 is maintained as a layer between the spacer pair 235 and the substrate 200, as well as between the spacer pair 235 and gate 210. Removal of unwanted material may occur using an anisotropic etching process such as, for example, reactive ion etching (RIE) or plasma etching (not shown).

Figure 2E:
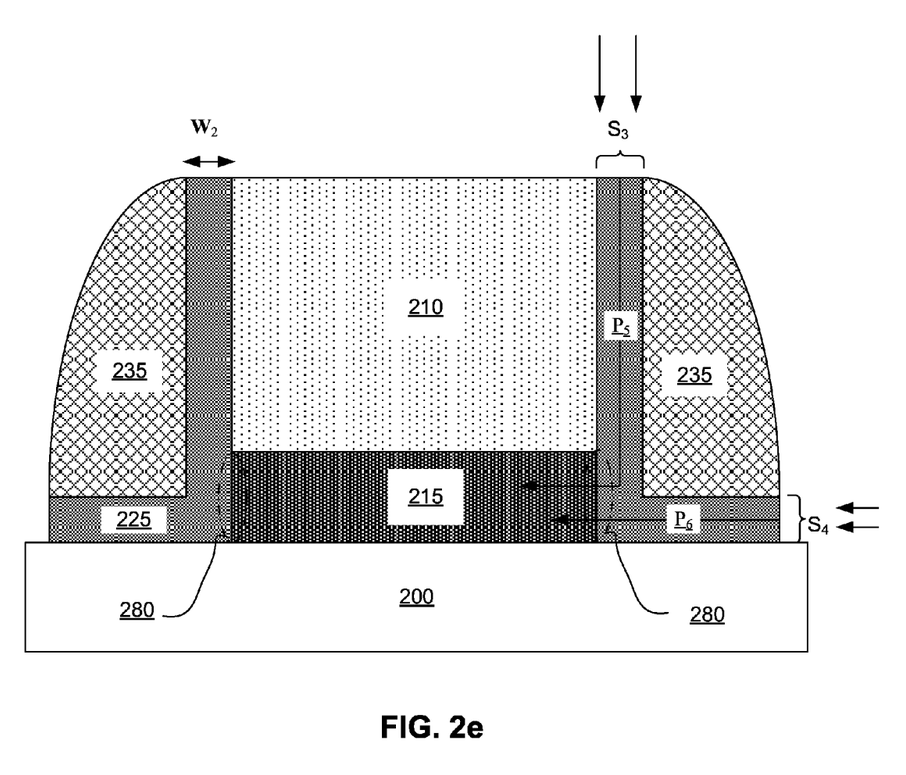
FIG. 2e is a cross-sectional view depicting introducing oxygen into a gate dielectric layer, according to an exemplary embodiment.

Referring to FIG. 2e, introduction of oxygen into the gate dielectric layer 215 may be performed. In exemplary embodiments, oxygen may be introduced into the gate dielectric layer 215 by placing the structure in an oxygen environment and allowing the oxygen to diffuse into the gate dielectric layer 215. Oxygen diffusion from the environment, and into the gate dielectric layer 215 may occur, and be mediated by, oxygen vacancies in the oxygen transport layer 225. As illustrated in FIG. 2e, oxygen in the surrounding environment may be absorbed at the top surface $S_3$ of the oxygen transport layer 225 and follow a vertical diffusion pathway, similar to $P_5$, through a substantially vertical portion of the oxygen transport layer 225. Alternatively, oxygen in the surrounding environment may be absorbed at the side surface $S_4$ of the oxygen transport layer 225 and follow a horizontal diffusion pathway, similar to $P_6$, through a substantially horizontal portion of the oxygen transport layer 225. Oxygen in the oxygen transport layer 225 may then pass through a contact region 280, into the gate dielectric layer 215. As illustrated, the contact region 280 may be formed at the interface between the oxygen transport layer 225 and the gate dielectric layer 255. Varying the amount of oxygen contained in the gate dielectric layer 215 may lead to changes in the threshold voltage of the device. Thus, controlling the amount of oxygen that passes through the contact region 280 and into the portion of the gate dielectric layer 215 may allow for tuning the threshold voltage based on the diffused oxygen concentration in the gate dielectric layer 215.

The amount of oxygen that passes through the contact region 280 may be controlled by changing the thickness of the oxygen transport layer 225. Increasing the thickness of the oxygen transport layer 225 increases the width of the oxygen diffusion pathway $W_2$. Increasing the width of the oxygen diffusion pathway $W_2$ may increase the amount of oxygen that passes through the contact region 280. Conversely, decreasing the thickness of the oxygen transport layer 225, decreases the width of the oxygen diffusion pathway $W_2$, and may decrease the amount of oxygen that passes through the contact region 280. Thus, changing the width of the oxygen transport layer 225 controls the amount of oxygen that may diffuse into the gate dielectric layer 215, and ultimately controls the final threshold voltage of the gate. Following oxygen diffusion, the gate dielectric may contain, but is not limited to, an oxygen vacancy concentration ranging from, for example, approximately $1\times10^{12}$ to approximately $1\times10^{14}$ cm$^{-2}$.

In some embodiments, introducing oxygen may be performed using a high temperature oxygen anneal. The high temperature anneal may be performed at temperatures ranging from approximately 300° Celsius to approximately 500° Celsius and may be annealed for approximately 30 to approximately 1800 seconds. In some embodiments, the annealing temperature may be substantially uniform throughout the annealing period, however in other embodiments the annealing period may include one or more ramping cycles where the temperature is decreased or increased.

Following the introduction of oxygen a semiconductor structure of FIG. 2e may include a gate dielectric directly contacting a substrate. The oxygen transport layer 225 may be present adjacent to the gate dielectric layer 215, where the oxygen transport layer 225 has at least a portion extending vertically along the outside of the sidewalls. The oxygen transport layer 225 has a surface $S_3$ that forms an interface between the structure and the gaseous environment. Additionally, the oxygen transport layer 225 may extend horizontally along the substrate and the oxygen transport layer 225 has a surface $S_4$ that forms an interface between the structure and the gaseous environment. The spacer pair 235 is located adjacent to the vertical portions of the oxygen transport layer 225, on the vertical surface furthest from the gate structure. In some embodiments, the gate dielectric layer 215 may contain a substantially uniform amount of oxygen, or oxygen vacancies, and may be substantially similar to the oxygen concentration, or oxygen vacancy concentration, of the oxygen transport layer 225 near the surfaces $S_3$ and $S_4$. In other embodiments, the gate dielectric layer 215 may contain a range of concentrations, wherein the lowest oxygen concentration (and highest oxygen vacancy concentration) is near the center of the gate dielectric layer 215, and the highest oxygen concentration (and lowest oxygen vacancy concentration) is near the portion of the gate dielectric layer 215 closest to contact region 280. In such embodiments, the gate dielectric layer 215 may contain a concentration different from the oxygen concentration of oxygen transport layer 225 near the surfaces $S_3$ and $S_4$.

Figure 3:
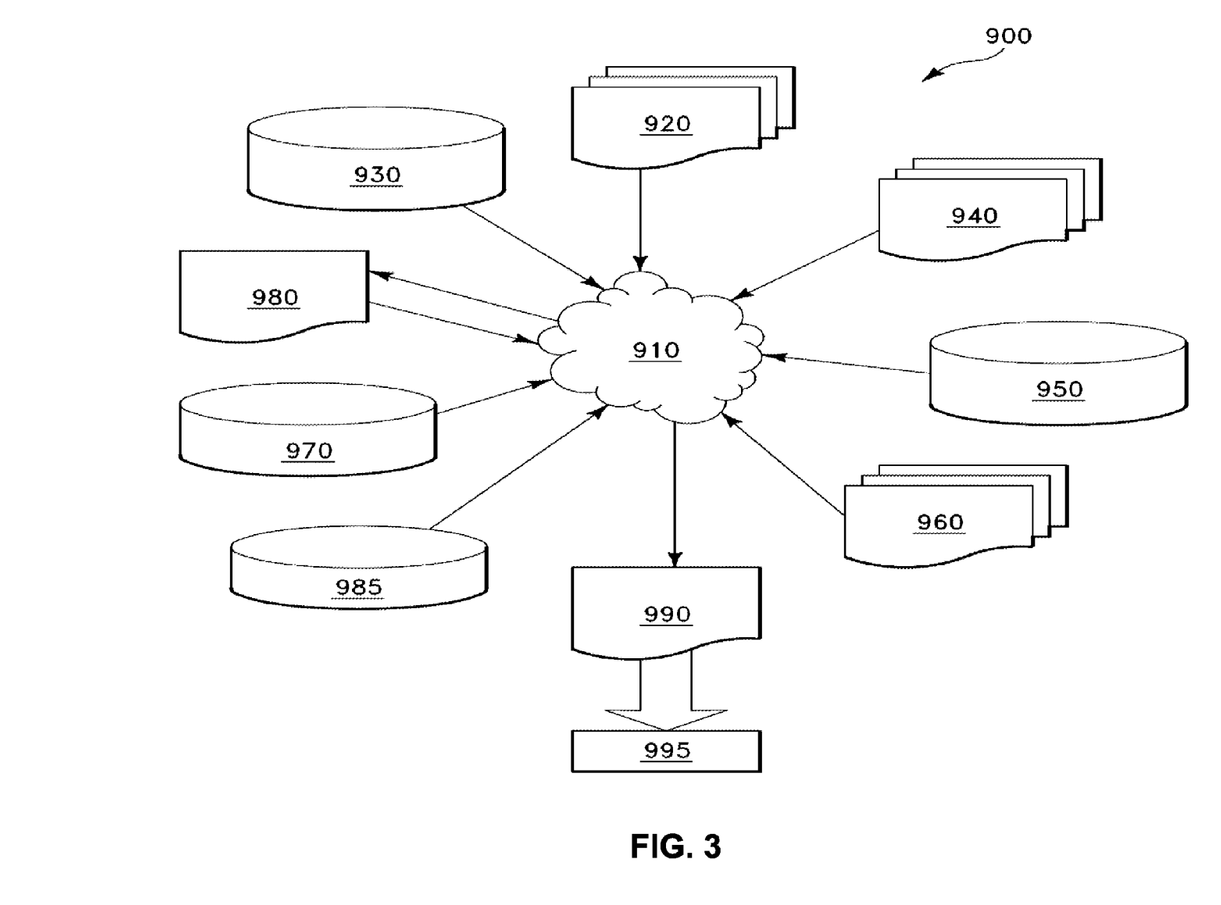
FIG. 3 shows a block diagram of an exemplary design flow, according to an exemplary embodiment.

FIG. 3 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1i, & 2e. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is preferably processed by a design process 910. In one embodiment, the design structure 920 comprises design data used in a design process and comprising information describing embodiments of the invention with respect to the structures as shown in FIGS. 1i, & 2e. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiments of the invention, as shown in FIGS. 1i, & 2e. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIGS. 1i, & 2e. As such, design structure 920 may comprise files or other data structures including human and/or machine-readable source code, compiled structures, and computer-executable code structures that when processed by a design or simulation data processing system functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1i, & 2e to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1i, & 2e. In one or more embodiments, design structure 990 may comprise a compiled, executable HDL simulation model that functionally simulates the devices shown in FIGS. 1i, & 2e.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 1i, & 2e. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
    depositing a first dielectric layer over a substrate and over a dummy gate structure;
    depositing a second dielectric layer over the deposited first dielectric layer;
    forming a spacer pair on the dummy gate structure based on a portion of the second dielectric being deposited on a portion of the first dielectric layer located on opposing sidewalls of the dummy gate structure;
    removing the dummy gate structure and forming a recess region;
    forming, within the recess region, a gate dielectric layer, wherein the formed gate dielectric layer is located on the portion of the first dielectric layer and top surface of the substrate exposed by the recess region;
    depositing, within the recess region, a gate electrode on the gate dielectric layer; and
    subsequent to the depositing, within the recess region, a gate electrode on the gate dielectric layer, exposing the semiconductor structure to an oxygen environment, wherein the portion of the first dielectric layer transports oxygen to the gate dielectric layer when exposing the semiconductor structure to an oxygen environment, wherein exposing the semiconductor structure to an oxygen environment comprises an oxygen anneal.

2. The method of claim 1, wherein the exposing the semiconductor structure to the oxygen environment comprises diffusing the oxygen into an exposed top region of the first dielectric layer for transporting the diffused oxygen to the gate dielectric layer via a bottom region of the first dielectric layer.

3. The method of claim 2, wherein the bottom region of the first dielectric layer comprises a contact region between the first dielectric layer and the gate dielectric layer.

4. The method of claim 1, wherein the oxygen anneal comprises heating the semiconductor structure to a temperature between approximately 300° Celsius to approximately 500° Celsius.

5. The method of claim 1, wherein the first dielectric layer comprises a high-K dielectric.

6. The method of claim 1, wherein the first dielectric layer and the gate dielectric layer are the same material.

7. The method of claim 1, wherein the depositing a first dielectric layer includes adjusting a thickness of the first dielectric layer.

8. The method of claim 1, wherein the depositing a first dielectric layer includes depositing the first dielectric layer to a predetermined thickness for tuning of a gate threshold voltage to a target threshold voltage.

9. The method of claim 1, wherein the method includes controlling oxygen diffusion into the gate dielectric layer so that a center of the gate dielectric layer has a lower concentration of oxygen than an ingress of the gate dielectric area.

10. A method of forming a semiconductor structure, the method comprising:
- depositing a first dielectric layer over a substrate and over a dummy gate structure;
- depositing a second dielectric layer over the deposited first dielectric layer;
- forming a spacer pair on the dummy gate structure based on a portion of the second dielectric being deposited on a portion of the first dielectric layer located on opposing sidewalls of the dummy gate structure;
- removing the dummy gate structure and forming a recess region;
- forming, within the recess region, a gate dielectric layer, wherein the formed gate dielectric layer is located on the portion of the first dielectric layer and top surface of the substrate exposed by the recess region;
- depositing, within the recess region, a gate electrode on the gate dielectric layer; and
- exposing the semiconductor structure to an oxygen environment, wherein the portion of the first dielectric layer transports oxygen to the gate dielectric layer when exposing the semiconductor structure to an oxygen environment, wherein exposing the semiconductor structure to an oxygen environment comprises an oxygen anneal, wherein the exposing the semiconductor structure to the oxygen environment comprises diffusing the oxygen into an exposed top region of the first dielectric layer for transporting the diffused oxygen to the gate dielectric layer via a bottom region of the first dielectric layer and diffusing the oxygen into an exposed top region of the gate dielectric layer.

* * * * *

UNITED STATES PATENT AND TRADEMARK OFFICE
CERTIFICATE OF CORRECTION

PATENT NO. : 9,620,384 B2  
APPLICATION NO. : 14/323036  
DATED : April 11, 2017  
INVENTOR(S) : Ando et al.

Page 1 of 1

It is certified that error appears in the above-identified patent and that said Letters Patent is hereby corrected as shown below:

On the Title Page

In the Assignee (73): Insert -- GlobalFoundries Inc. --

Signed and Sealed this  
Thirtieth Day of May, 2017

Michelle K. Lee  
*Director of the United States Patent and Trademark Office*